US006707295B1

(12) United States Patent
Te Lintelo et al.

(10) Patent No.: US 6,707,295 B1
(45) Date of Patent: Mar. 16, 2004

(54) METHOD FOR DISTINGUISHING BETWEEN SEMI-SOFT AND SOFT MAGNETIC MATERIAL

(75) Inventors: Johannes Te Lintelo, Philippine (NL); John Fisher, Hertfordshire (GB); Paul Robertson, Hertfordshire (GB)

(73) Assignee: N. V. Bekaert S.A., Zwevegem (BE)

( * ) Notice: Subject to any disclaimer, the term of this patent is extended or adjusted under 35 U.S.C. 154(b) by 34 days.

(21) Appl. No.: 10/111,482

(22) PCT Filed: Oct. 23, 2000

(86) PCT No.: PCT/EP00/10722

§ 371 (c)(1),
(2), (4) Date: Jul. 30, 2002

(87) PCT Pub. No.: WO01/33525

PCT Pub. Date: May 10, 2001

(30) Foreign Application Priority Data

Nov. 1, 1999 (EP) ........................................... 99203618
May 25, 2000 (EP) ........................................... 00201820

(51) Int. Cl.[7] ........................ G01V 15/00; G01N 27/72; G01R 33/12; G08B 13/24

(52) U.S. Cl. ....................... 324/233; 324/239; 340/551; 340/572.6

(58) Field of Search ................................ 324/222–243; 235/449, 450; 340/540, 541, 568.1, 572.1, 572.6, 551, 572.5, 572.7

(56) References Cited

U.S. PATENT DOCUMENTS 4,791,412 A 12/1988 Brooks
5,189,397 A 2/1993 Watkins et al.
5,204,526 A 4/1993 Yamashita et al.
5,353,010 A * 10/1994 Sanetra .................... 340/572.4
5,793,289 A * 8/1998 Strzelec .................... 340/572.2

FOREIGN PATENT DOCUMENTS

| | | |
|---|---|---|
| EP | 0 295 085 | 12/1988 |
| EP | 0 366 335 | 5/1990 |
| WO | 98/26377 | 6/1998 |
| WO | 98/26378 | 6/1998 |

* cited by examiner

*Primary Examiner*—N. Le
*Assistant Examiner*—Reena Aurora
(74) *Attorney, Agent, or Firm*—Foley & Lardner

(57) ABSTRACT

A method for distinguishing between a semi-soft magnetic material, having a magnetic saturation field H sub s ranging from 100A/m to 3000 A/m, and a soft magnetic material, having a magnetic saturation field H sub s ranging from 3 A/m to 100 A/m, includes (a) emitting an electromagnetic drive signal of one or more particular frequencies to an article so that any present semi-soft magnetic material or soft magnetic material in the article go into saturation for both positive and negative magnetic fields; (b) detecting an electromagnetic detection signal (20) emanating from the article; (c) measuring time or relative phase delays (A, B) between one or more reference points of the drive signal and points at which positive and negative peaks of the detection signal occur; (e) comparing the measured time or relative phase delays with values which are typical for semi-soft magnetic or soft magnetic features in order to make a decision whether the material is soft magnetic or semi-soft magnetic.

18 Claims, 3 Drawing Sheets

METHOD FOR DISTINGUISHING BETWEEN SEMI-SOFT AND SOFT MAGNETIC MATERIAL

FIELD OF THE INVENTION

The present invention relates to a method for distinguishing between a semi-soft magnetic materialand a soft magnetic material. The semi-soft material and/or the soft magnetic material may be used as a security feature in or on the substrate of a security article.

BACKGROUND OF THE INVENTION

Soft magnetic security features are well known in the art of electronic article surveillance systems (EAS) and are often called anti-pilferage tags. The EAS systems make use of the non-linear magnetic properties of the B-H loop of the soft magnetic material. Small activating fields typically drive the soft magnetic material into saturation. Sensitivity to small fields is required here because it is difficult to generate a large magnetic field at a distance from a source, and typical EAS systems need to interrogate as large a volume as possible, e.g. the public access routes in and out of shops. The security features used here are therefore commonly based upon very soft magnetic materials such as the amorphous Metglas® or Vitrovac® or thin films such as made of a $Co_aFe_bNi_cMo_dSi_eB_f$alloy, where a to f are atomic percentages and a ranges between 35% and 70%, b between 0% and 8%, c between 0% and 40%, d between 0% and 4%, e between 0% and 30%, f between 0% and 30%, with at least one element of each of the groups (b, c, d) and (e, f) being non zero. Such a $Co_aFe_bNi_cMo_dSi_eB_f$ composition is hereinafter referred to as a CoFeNiMoSiB composition. CoFeNiMoSiB films are marketed under the name of Atalante®. The term "thin " here refers to a film having a thickness, which is smaller than 10 micrometer. These materials have a very low coercivity and a high magnetic permeability.

Within the context of the present invention, the terms "soft magnetic material " typically refer to materials having a low magnetic saturation field $H_s$, i.e. those materials require a magnetic field ranging between 3 A/m and 100 A/m (measured at 1 kHz) to saturate.

Using non-linear magnetic properties for the authentication of objects could also be an attractive approach because of simplicity and sensitivity. However, the approach would be of little use if the security elements set-off the alarms of the gates commonly used for EAS. The approach would also be of little use unless the security elements were difficult to obtain or copy.

Patent applications WO-A-98/26378 and WO-A-98/26377 disclose how to solve the above problem. The security element used comprises small, elongated magnetic particles which require a magnetic field greater than 100 A/m, and preferably greater than 300 A/m, to saturate. This property is chosen to ensure that the magnetic hardness of the particles is sufficiently high that they will not be driven into saturation at the field strengths commonly used in EAS gates. The security feature used here will therefore not set-off the alarm of the EAS gates.

In addition it is desirable to keep the magnetic field required for saturation well below that at which more commonly available Ferro-magnetic materials will saturate and to keep it at a sufficiently low level that the particles can be saturated, and therefore detected, at short ranges from a compact reading apparatus. In general this implies magnetic fields of less than about 3000 A/m.

Within the context of the present invention, the terms "semi-soft magnetic material " refer to magnetic materials typically having a magnetic saturation field $H_s$ ranging from 100 A/m to 3000 A/m, e.g. from 200 A/m to 3000 A/m, preferably from 300 A/m to 3000 A/m (measured at 1 kHz).

Although the generation of high harmonics at low magnetic field strengths is particular to the soft magnetic materials in the case of EAS and to the semi-soft magnetic materials in the case of authentication, the inventors have discovered, however, that there is no clear difference between the harmonics generated from these types of materials. This is particularly true if the orientation of the security element is varied relative to the magnetic field.

Another problem with soft magnetic materials and semi-soft magnetic materials is that soft magnetic materials may be looked as semi-soft magnetic materials at a great distance between the drive coil and the material.

Moreover the drive field at which the security element will saturate, will vary with the orientation of the security element in the field. These problems can be solved by making the authentication method a contact one or by ensuring that the spatial orientation of the drive coil and material are fixed. However, for hand-held applications it is most convenient to validate the security element with a non-contact reading where the spatial orientation between drive coil and material is not fixed.

Still another problem is that there may be a magnetic field, external to the field generated by the drive coil, which could bias the total field.

EP-A1-0295085, EP-A2-0366335 and U.S. Pat. No. 5,204,526 all disclose magnetic material in the form of thin films or in the form of thin strips or wires used as markers or identifiers in detection or recognition systems. All documents suggest the use of magnetic material with two or more different coercive forces. These documents, however, are silent with respect to the difference between soft magnetic and semi-soft magnetic materials.

SUMMARY OF THE INVENTION

It is an object of the present invention to avoid the problems of the prior art.

It is a further object of the present invention to provide an authentication system, which can discriminate between various types of soft magnetic and semi-soft magnetic materials.

It is a further object of the present invention to provide a non-contact and a hand-held method for authentication.

It is also an object of the present invention to provide a compact low cost reading apparatus, which can be used to detect the special markers at distances up to a few centimeters.

According to the invention there is provided a method for distinguishing between a semi-soft magnetic material and soft magnetic material. The method comprises following steps:

(a) emitting an electromagnetic drive signal of one or more particular frequencies to an article so that any present semi-soft magnetic or soft magnetic material in the article go into saturation for both positive and negative magnetic fields;

(b) detecting an electromagnetic detection signal emanating from the article;

(c) measuring time or relative phase delays between one or more reference points of the drive signal and points at which positive and negative peaks of the detection signal occur;

(d) comparing the measured time or relative phase delays with values, which are typical for semi-soft magnetic material in order to make a decision whether the material is soft magnetic or semi-soft magnetic.

The method may comprise a further step of measuring the heights of the positive and negative peaks. The height of the peaks of the detection signal gives an indication about the distance or the orientation of the article. In a preferable embodiment only measurements which fall within a predetermined range of the heights are further processed. The time or relative phase delay between a reference point of the drive signal and a point at which the peaks occur give, together with the height of the peaks, an indication of the magnetic softness of the article.

Due to the fact that an indication is given about the distance or orientation of the material, the detection method can be a non-contact method, and more particularly a hand-held method. Within the context of the present invention, the terms "hand-held method" refer to the use of a small and light weigth detection apparatus with sizes not much greater than sizes of current available palm top organizers or portable telephones. A hand-held method is a method which can be applied outside a dedicated laboratory. The hand-held method can be applied everywhere, e.g. at the point of sales or point of transaction, in order to check magnetic security features in articles.

In a preferable embodiment of the invention, following steps occur:

(a) a first time or relative phase delay (A) between a first reference point of the drive signal current and the point at which a positive peak occurs is measured;

(b) a second time or relative phase (B) between a second reference point of the drive signal current and the point at which a negative peaks occurs is measured;

(c) the first and second time or relative phase delays (A and B) are summed.

The first reference point of the drive signal current may be equal to or different from the second reference point of the drive signal current. As will be explained hereafter, this sum A+B results in a reliable indication for the coercive force of the magnetic material used in the article and in a reliable indication whether the magnetic material is soft magnetic or semi-soft magnetic.

In a preferable embodiment the electromagnetic detection signal is proportional to the rate of change of magnetic flux density in the article (dB(t)/dt).

In another example the electromagnetic detection signal is proportional to an integral of the rate of change of magnetic flux density in the article (B(t)).

In a more elaborated example, the detection method further comprises a step of measuring the width of the peaks of the detection signal at one or more levels in order to discriminate semi-soft magnetic security features from Ferro-magnetic materials such as iron.

The magnetic material used as security feature can take many forms.

In a typical example the semi-soft magnetic security feature comprises a number of fibres such as disclosed in the above-mentioned patent applications WO-A-98/26378 and WO-A-98/26377.

In another example the semi-soft magnetic security feature comprises a thin semi-soft magnetic film.

In both examples the demagnetisation factor N of the fibres or the thin films is very low. Preferably, the demagnetisation factor N ranges from $10^{31\ 5}$ to $10^{31\ 2}$, e.g. from $10^{31\ 5}$ to $10^{31\ 3}$, preferably from $10^{31\ 5}$ to $10^{31\ 2}$. Such low demagnetisation factor N means that the effective magnetic permeability $\mu_r'$ at the a.c. frequency of operation is not reduced very much in comparison with the bulk permeability $\mu_r$ and remains very high.

In a preferable embodiment of the invention, the magnetic material used as security feature comprises two or more types of magnetic material with different magnetic coercivity values or coercive forces, e.g. two or more different thin semi-soft magnetic films. In comparison with security features which only comprise a single semi-soft magnetic material with only one coercivity value, such a security feature with two or more different values of coercivity has the following advantages:

(a) it is easier to detect and to distinguish from other soft magnetic and semi-soft magnetic materials;

(b) it is more difficult to copy as security feature (c) The detection algorithm is more difficult to copy.

In a preferable embodiment of the invention, the level of magnetic noise in the magnetic material is also detected. This level of magnetic noise is determined by measuring the variability of the electromagnetic detection signal. The noise is believed to be caused as the varying drive field causes discontinuous jumps in the magnetisation due to jumps in the positions of boundaries between adjacent domains. This phenomenon as such is generally known as the Barkhausen effect. The magnitude of the magnetic noise is dependent on the magnitude of the field and on the materials, grain sizes and geometry of the structure. It can therefore be used to identify particular materials and constructions.

The magnetic noise can be tailored by varying the thickness, composition and texture of both the underlayer and magnetic layer of the tag material. The texture of the underlayer, which depends amongst others on the thickness and composition, induces a texture in the magnetic layer that results in pinning centers for the magnetic domain walls. Moreover the small thickness of the magnetic layer results in considerable surface pinning effects for the domain walls. The underlayer and thinness of the magnetic layer combined results in a magnetic noise that can be tailored.

If the distance between the detector coils and tag varies, as would occur with a hand-held reader for example, then this would give a variation in the returned signal which could be confused with the effect of magnetic noise. We have found however that this effect can effectively be minimised by differencing subsequent readings of the returned signal amplitude in the following way.

Therefore the variability (V) is calculated from following formula:

$$V = \sum_{i=1}^{n-2} [(P_{i+2} - P_{i+1}) - (P_{i+1} - P_i)]^2$$

where n is the number of measurements of the amplitude of the electromagnetic detection signal (20).

Taking five (5) as the number of measurements, then P1 to P5 are five measured readings of the detection signal amplitude then a variability parameter can be calculated from:

$$V=((P_3-P_2)-(P_2-P_1))^2+((P_4-P_3)-(P_3-P_2))^2+((P_5-P_4)-(P_4-P_3))^2$$

This calculation has the advantage of removing linear variations in the amplitude. In practice, with a hand-held reader it is found that a sampling rate for the signal can be determined which is slow enough to see the effect of the magnetic noise, but which is fast enough that the variation due to movement of the detector, relative to the tag, gives a closely linear relationship between the successive readings. It may be desirable to base the measurement on more or less than five readings.

BRIEF DESCRIPTION OF THE DRAWINGS

The invention will now be described into more detail with reference to the accompanying drawings wherein FIG. 1 compares a dB/dt signal coming from a soft magnetic material with a dB/dt signal coming from a semi-soft magnetic material.

DESCRIPTION OF THE PREFERRED EMBODIMENTS OF THE INVENTION.

In a detector apparatus one or more coils, the drive coils, are driven with an alternating current to drive the security elements into saturation for both positive and negative magnetic fields. One or more coils, the detection coils, are used to detect the returned signal which is proportional to the rate of change of flux with time (dB(t)/dt). Signal processing electronics is then used to process and analyse the signals and to provide an indicator signal which may be visual or auditive, when materials having the correct magnetic properties are situated in the drive field.

Figure 1:
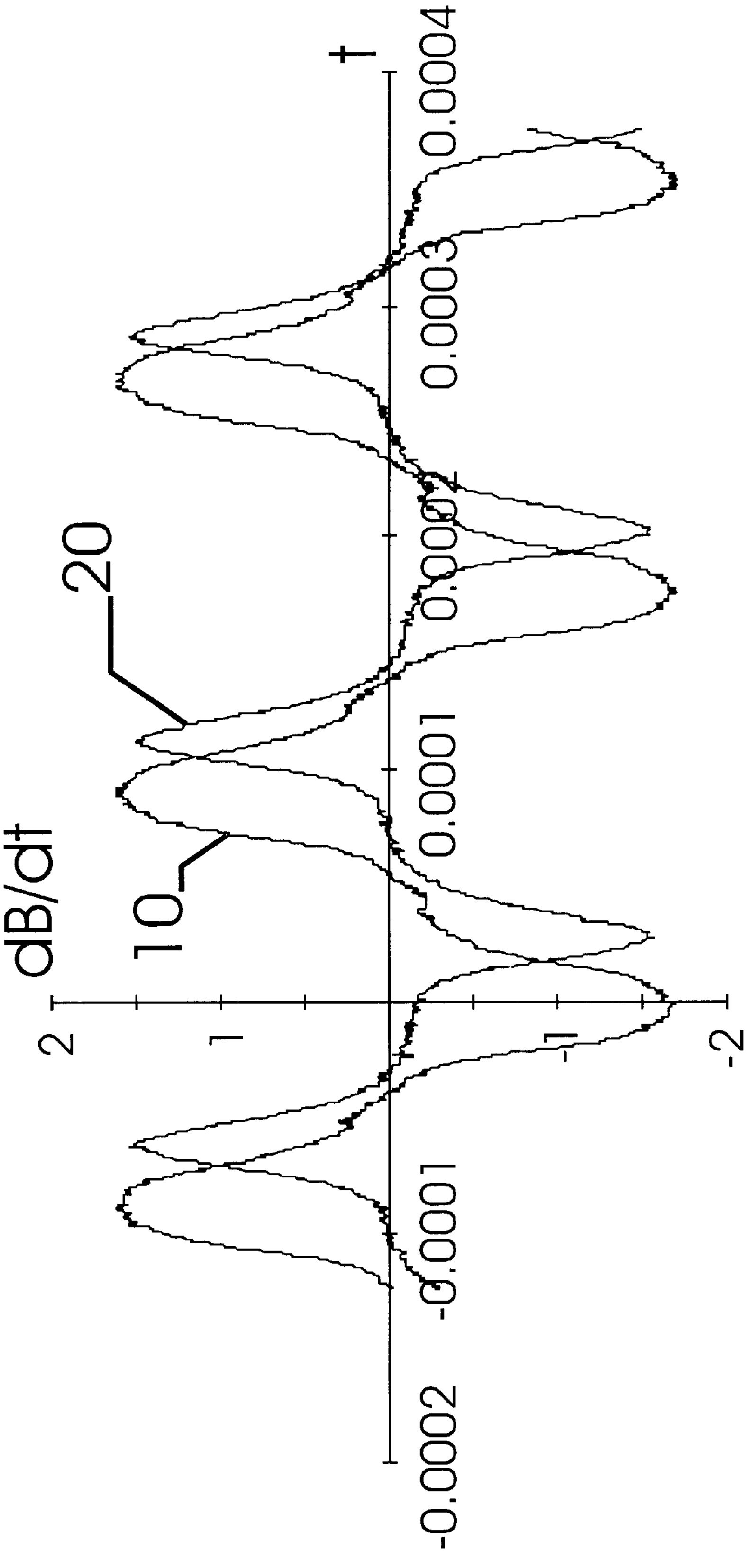

FIG. 1 shows time plots 10 and 20 of typical dB(t)/dt signals received from two magnetic materials with different magnetic properties. It can be seen that the two materials have both different shapes and that they occur at different distances along the time axis, which is referenced to the drive current in the drive coils. In this plot the peaks of the signal correspond with the maximum slope of the B-H loop. The material corresponding to plot 10 is a soft magnetic material; the material corresponding to plot 20 is a semi-soft magnetic material.

Figure 2:
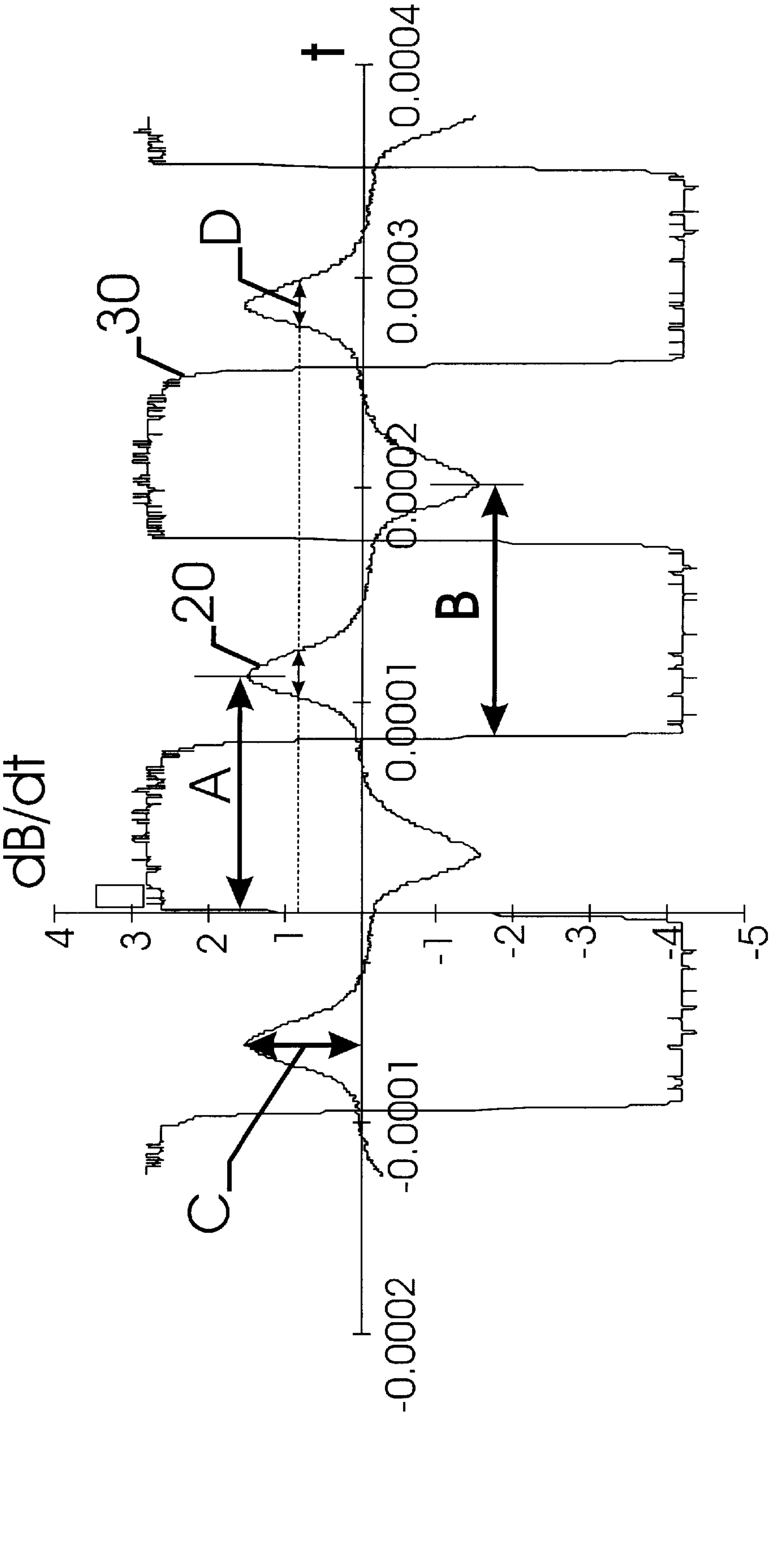
FIG. 2 illustrates what values can be measured on a dB/dt curve in a detection method according to the invention.

FIG. 2 shows a time plot 20 of a typical dB(t)/dt signal received from a semi-soft magnetic material and of a square wave 30. Square wave 30 is derived from the sinusoidal drive current to the drive coils. This square wave 30 is used to provide references to start measuring the A-value and the B-value. The first reference point for the A-value coincides with the point where the drive signal starts becoming positive (=start positive square wave). The second reference point for the B-value coincides with the point where the drive signal starts becoming negative (=start negative square wave). Both the A-value and the B-value are time or relative phase delays between reference points of the drive signal and a point at which the peaks in the dB(t)/dt occur. In terms of signal processing it has been found practical to sum the A-value and the B-value to obtain an indication on the magnetic hardness of the material under detection. The height C of the peaks of the dB(t)/dt signal is also measured. Only measurements of C within a certain range of amplitude are further processed since measurements of C lying outside that range indicate that the article under detection is too remote or is too close. The height C provides information the distance or the orientation of the magnetic material. Due to the fact that an indication is given about the distance or orientation of the material, the detection method can be a hand-held method. Alternatively, if increased precision of measurement is needed, it may be used in a configuration in which the distance and orientation of the material from the signal drive and detection means is known. The measurement of the magnetic hardness can then reliably based on the sum of the above-mentioned A- and B-values. Using this approach it has been found to be possible to minimise the effect of external fields and to give reliable discrimination between materials of different hardness. This reliability can be explained as follows. The A-value is the time interval between a reference and a positive peak and the B-value is the time interval between a reference and a negative peak. Any extraneous magnetic fields are compensated in this way.

It has also been found that adding into the recognition algorithm a parameter based on the shape of the positive and/or negative pulses of the dB(t)/dt signal can give a further improvement in the ability to discriminate materials. One example of this parameter is the width D of the peak at one or more levels of the dB(t)/dt signal. Measurement of D is a good way to determine if the returned signal is from a large object of common Ferro-magnetic materials such as iron. Magnetically hard materials such as iron will not be saturated by the detector field but they will return a large sinusoidal signal. The shape of dB(t)/dt signals returned from iron is much more rounded than the signals from soft magnetic and semi-soft magnetic materials as shown in FIGS. 1 and 2. To improve the consistency of the width measurement for different magnitudes of the returned signal it is beneficial to use a circuit which tracks the peak value and then measures the width at one or more fixed fractions of the peak value.

If the security feature is constructed from several materials with different magnetic properties, and particularly if this property is the magnetic field required to drive them into saturation, then the returned signal will show changes in shape as each material goes into saturation. In fact, a double or a triple superimposed B-H hysteresis curve is obtained, because of the different magnetic properties. Ferromagnetic coupling between the various magnetic materials also effects this curve, which means that the coercivity values of the various materials taken in isolation, will be changed due to the combination of the materials. In the case of thin films, this ferromagnetic coupling is largely dependent upon the thickness of the layers so that a wide variety of security features can be obtained.

The relative positions of the shape changes of the B-H curve can be used in the same way as for the single materials to determine parameters proportional to the hardness of the materials. An example of such a security element is a combination of a thin CoFeNiMoSiB film with a thin film of an amorphous $Co_xZr_yNb_z$alloy.

As is well known, the magnetic properties of the materials can be strongly affected by the shape factor (the ratio of length to cross-section area). For example, if the security feature is in the form of magnetic fibres of high permeability material, then the field at which they will saturate can be controlled by altering the length to diameter ratio. However, altering the orientation of the fibres relative to the magnetic field will also change the field at which they will saturate and so this needs to be taken into account in interpreting the signals from the reading apparatus. One example, if the fibres are randomly distributed in the substrate, is to extract the minimum saturation field to determine the type of material present. An alternative would be to orient the fibres so that they can be aligned with the interrogating magnetic field.

If the security feature is made up from a combination of materials showing a significant anisotropy between the saturation field in the hard and soft directions, and these materials are arranged with their soft axes at a range of discrete angles, then the signal from a relative rotation between the detector and material will show peaks as the drive field aligns with each soft axis direction. This approach can be used to provide a coded signal. The reference point for the coded signal could be one layer with a greater thickness or permeability, which would always give a greater signal than the other layers, or it could be via an optical security feature and associated sensor system. An altemative would be to use the shape anisotropy of magnetic fibres, which could then be aligned at a series of discrete angles in the substrate to give the same effect as, described above.

Figure 3:
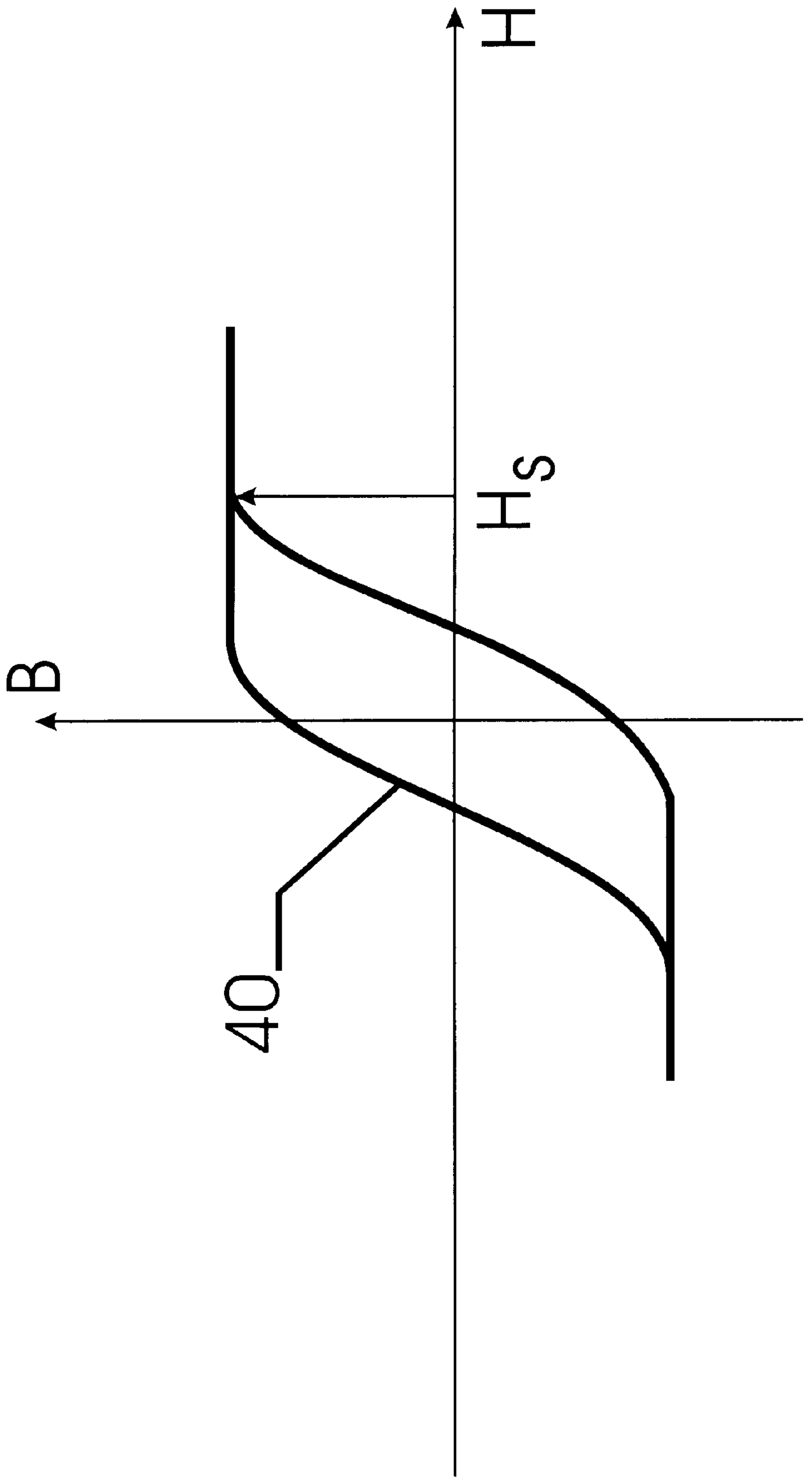
FIG. 3 illustrates the definition of magnetic saturation field $H_s$.

FIG. 3 illustrates the definition of magnetic saturation field $H_s$ which is used here to differentiate between soft magnetic and semi-soft magnetic material. The terms "magnetic saturation field $H_s$" are herein defined as the applied magnetic field at the onset of the flux density in the ferromagnetic particles, above which point the variation of the flux density in the particles with the applied field becomes substantially non-linear, as illustrated by the BH-curve 40.

As an example for the preferable embodiment of measuring the variability of the detection signal, thin films of ferromagnetic alloys can be manufactured by DC or AC or RF sputtering to produce particularly large magnetic noise effects which are not seen in other materials. To illustrate this the table below shows examples of the magnetic noise parameter for different soft magnetic materials, which are used in electronic article surveillance (EAS) tags, compared with new thin film material based on DC sputtering.

TABLE

| Material | Variability V |
|---|---|
| Thin film EAS tag 1 | 2.3 |
| Thin film EAS tag 2 | 1.7 |
| Vitrovac ™ material | 1.0 |
| Mu-metal material | 2.3 |
| Sensormatic ™ wire | 1.4 |
| New thin film material | 16.3 |

In a preferred embodiment of the invention the detection apparatus uses a sinusoidal drive field applied to the tag from a ferrite core assembly. Additional coils on the assembly are used to detect the signal returned from the tag, which is proportional to the rate of change of the induced magnetic flux, i.e. dB/dt.

With this arrangement the field from the drive coils is directly coupled into the detector coils. Thus the signal at the fundamental frequency which is induced in the detector coils is very much higher than the returned signal. It is difficult therefore to isolate this signal. It has been found that a particularly simple and effective way to isolate the returned signal is first to minimise the mutual inductance between the drive and pick-up coils, to avoid saturating the signal amplifiers, and then to use electronic filtering. The approach is based on the fact that the electronic system, including a sinusoidal oscillator and the drive coil assembly, can be designed so that it gives negligible harmonics in the 2nd order or higher. In comparison the returned signal from a tag which is driven into magnetic saturation by the applied field has a large amount of its energy in the harmonics. A sharp, high pass filter can therefore be designed to isolate the signal from the tag from that due to the direct coupling from the drive field. Alternatively, and in a preferred embodiment a deep notch filter is used for the fundamental. The filter is designed to have a constant time delay for the higher harmonics, up to the 10th harmonic or even more. Thus the dB/dt signal goes through with a fixed time delay but without being unduly distorted. After filtering the returned signal can then be amplified and fed into electronic circuits which measure the amplitude and the relative timing of the peaks and widths of the dB/dt signals. In a preferred embodiment a microcontroller circuit then processes the signals and a software algorithm determines which type of material is present. If the properties match the new tag material then an output pulse is generated to sound a beep and to illuminate an LED.

What is claimed is:

1. A method for distinguishing between a semi-soft magnetic material, having a magnetic saturation field $H_s$ ranging from 100 A/m to 3000 A/m, and a soft magnetic material, having a magnetic saturation field $H_s$ ranging from 3 A/m to 100 A/m, said method comprising following steps:

(a) emitting an electromagnetic drive signal of one or more particular frequencies to an article so that any present semi-soft magnetic material or soft magnetic material in said article go into saturation for both positive and negative magnetic fields;

(b) detecting an electromagnetic detection signal (20) emanating from said article;

(c) measuring time or relative phase delays (A, B) between one or more reference points of the drive signal and points at which positive and negative peaks of the detection signal occur;

(e) comparing the measured time or relative phase delays with values which are typical for semi-soft magnetic or soft magnetic features in order to make a decision whether the material is soft magnetic or semi-soft magnetic.

2. A method according to claim 1 further comprising a step of measuring heights (C) of the positive and negative peaks.

3. A method according to claim 2, wherein only measurements which fall within a predetermined range of the heights (C) are further processed.

4. A method according to claim 1, wherein a first time or relative phase delay (A) between a first reference point of the drive signal and the point at which a positive peak occurs is measured, wherein further a second time or relative phase (B) between a second reference point of the drive signal and the point at which a negative peaks occurs is measured, and wherein further said first and second time or relative phase delays (A and B) are summed.

5. A method according to claim 1 wherein said method is a non-contact method.

6. A method according to claim 1 wherein said method is a hand-held method.

7. A method according to claim 1 wherein said electromagnetic detection signal is proportional to the rate of change of magnetic flux in the article (dB(t)/dt).

8. A method according to claim 1 wherein said electromagnetic detection signal is proportional to an integral of the rate of change of magnetic flux in the article (B(t)).

9. A method according to claim 1, said method further comprising a step of measuring the width (D) of the peaks of said detection signal at one or more levels in order to discriminate semi-soft magnetic and soft magnetic security features from Ferro-magnetic materials such as iron.

10. A method according to claim 1 wherein said semi-soft magnetic or soft magnetic material is constituted by a number of fibres.

11. A method according to claim 1 wherein said semi-soft magnetic or soft magnetic material is a thin film.

12. A method according to claim 10 wherein the demagnetisation factor N of the magnetic fibres or of the thin film varies between $10^{-5}$ and $10^{-4}$.

13. A method according to claim 1 wherein said semi-soft magnetic or soft magnetic material comprises two or more types of magnetic material with different coercivity values.

14. A method according to claim 13 wherein said semi-soft magnetic or soft magnetic material comprises two or more different thin soft magnetic films.

15. A method according to claim 1, said method further comprising the step of detecting the level of magnetic noise in the magnetic material.

16. A method according to claim 15 wherein said level of magnetic noise is determined by measuring the variability (V) of the electromagnetic-detection signal (20).

17. A method according to claim 16 wherein said variability (V) corresponds to following formula:

$$V = \sum_{i=1}^{n-2} [(P_{i+2} - P_{i+1}) - (P_{i+1} - P_i)]^2$$

where n is the number of measurements of the amplitude of the electromagnetic detection signal (20).

18. A method of providing semi-soft magnetic or soft magnetic material which is suitable to function as a security feature in a detection method according to claim 1, said method comprising combining two or more types of magnetic material with different magnetic coercivity values.

* * * * *